United States Patent
Tsuruta

(10) Patent No.: US 10,679,833 B2
(45) Date of Patent: Jun. 9, 2020

(54) CYLINDRICAL SPUTTERING TARGET

(71) Applicant: JX NIPPON MINING & METALS CORPORATION, Tokyo (JP)

(72) Inventor: Yoshitaka Tsuruta, Kitaibaraki (JP)

(73) Assignee: JX NIPPON MINING & METALS CORPORATION, Tokyo (JP)

(*) Notice: Subject to any disclaimer, the term of this patent is extended or adjusted under 35 U.S.C. 154(b) by 45 days.

(21) Appl. No.: 15/075,119

(22) Filed: Mar. 19, 2016

(65) Prior Publication Data
US 2016/0284524 A1 Sep. 29, 2016

(30) Foreign Application Priority Data

Mar. 23, 2015 (JP) .................. 2015-060110

(51) Int. Cl.
*C23C 14/34* (2006.01)
*H01J 37/34* (2006.01)

(52) U.S. Cl.
CPC ........ *H01J 37/3423* (2013.01); *H01J 37/342* (2013.01); *H01J 37/3435* (2013.01); *H01J 37/3491* (2013.01)

(58) Field of Classification Search
CPC ............................ H01J 37/342; H01J 37/3435
See application file for complete search history.

(56) References Cited

U.S. PATENT DOCUMENTS

| | | | |
|---|---|---|---|
| 2006/0151321 A1* | 7/2006 | Itoh | C23C 14/086 204/298.13 |
| 2009/0250337 A1* | 10/2009 | Simons | H01J 37/3435 204/192.15 |
| 2010/0326823 A1* | 12/2010 | Todoko | C23C 14/3414 204/298.13 |
| 2011/0005923 A1* | 1/2011 | Schnappenberger | H01J 37/3405 204/298.11 |
| 2011/0100808 A1 | 5/2011 | Todoko et al. | |
| 2013/0118898 A1 | 5/2013 | Shin et al. | |

(Continued)

FOREIGN PATENT DOCUMENTS

| | | |
|---|---|---|
| EP | 3018234 A1 | 11/2016 |
| JP | 2002-030431 A | 1/2002 |
| JP | 2009-221589 A | 10/2009 |

(Continued)

OTHER PUBLICATIONS

"Geometrical Product Specifications (GPS)—Indication of surface texture in technical product documentation" Japanese Standards Association, 2003. 1167-1168. (Year: 2003).*

(Continued)

*Primary Examiner* — Jason Berman
(74) *Attorney, Agent, or Firm* — Hauptman Ham, LLP

(57) ABSTRACT

A cylindrical sputtering target includes a cylindrical substrate and a cylindrical sputtering target member joined together with a joining material. Where the joining material has a thickness of d (µm), the joining material has a coefficient of thermal expansion of $\alpha_1$ (µm/µmK), and a melting point of the joining material and room temperature have a difference of $\Delta T$ (K), a surface of the cylindrical sputtering target member on the side of the joining material has a value of ten-point average roughness (Rz) fulfilling:

$d$ (µm)$\times\alpha_1$ (µm/µmK)$\times\Delta T$ (K)$\leq Rz$ (µm).

6 Claims, 2 Drawing Sheets

(56) References Cited

U.S. PATENT DOCUMENTS

2014/0124365 A1* 5/2014 Wurczinger ........ C23C 14/3414
204/298.13

FOREIGN PATENT DOCUMENTS

| | | |
|---|---|---|
| JP | 2009-242915 A | 10/2009 |
| JP | 2009-256719 A | 11/2009 |
| JP | 2010-018883 A | 1/2010 |
| JP | 2013-529253 A | 7/2013 |
| JP | 2014-037619 A | 2/2014 |
| JP | 2015-59269 A | 3/2015 |
| JP | 2015-132013 A | 7/2015 |
| JP | 2016-050358 A | 4/2016 |
| KR | 10-2014-0147961 A | 12/2014 |
| WO | 2015002253 A1 | 1/2015 |
| WO | 2016027599 A | 2/2016 |

OTHER PUBLICATIONS

Notice of Rejection from Japanese Patent Office, dated Sep. 29, 2015 for corresponding Japanese application No. 2015-060110.

Japanese Patent Opposition mailed on Sep. 23, 2016 for corresponding Japanese Patent 5909006 (Japanese Application No. 2015-060110) with partial translation.

Korean Notice of Rejection dated Dec. 1, 2016 for corresponding Korean Application No. 10-2016-0030958 with partial translation.

Taiwanese Notice of Rejection dated Jul. 12, 2016 for corresponding Taiwanese Application No. 10510671.

Chinese Office Action dated Aug. 9, 2018 for corresponding Chinese Application No. 201610150557.2, with partial English translation.

Decision of Refusal dated Apr. 20, 2018 for the corresponding Korean Application No. 10-2016-0030958. With partial English translation.

Korean Office Action dated Dec. 1, 2017 for the corresponding Korean Appl. No. 10-2016-0030958. With partial English translation.

Chinese Office Action dated Dec. 20, 2017 for the corresponding Chinese Appl. No. 201610150557.2. With partial English translation.

Notice of Allowance dated Dec. 12, 2018 for the corresponding Korean Appl. No. 10-2016-0030958, with English Machine Translation which was obtained from Global Dossier.

Decision of refusal dated Jun. 1, 2017 for corresponding Korean application No. 10-2016-0030958, with translation.

Korean Notice of Rejection dated Feb. 16, 2017, for the corresponding Korean application No. 10-2016-0030958.

Japanese Notice of Allowance dated Jan. 31, 2017, for corresponding Japanese application No. JP 2016-059703.

* cited by examiner

CYLINDRICAL SPUTTERING TARGET

CROSS REFERENCE TO RELATED APPLICATIONS

This application is based upon and claims the benefit of priority from the prior Japanese Patent Application No. 2015-60110 filed on Mar. 23, 2015, the entire contents of which are incorporated herein by reference.

FIELD

The present invention relates to a cylindrical sputtering target, and specifically to a ceramic cylindrical sputtering target joined to a cylindrical substrate (referred to also as a "backing tube").

BACKGROUND

As compared with a conventional flat sputtering target, a cylindrical (also referred to as "rotary" or "rotatable") sputtering target has an advantage of having a higher use efficiency because a sputtering target member thereof has an entire surface thereof eroded and thus is shaven uniformly. Therefore, the conventional flat sputtering target is now being replaced with the cylindrical sputtering target.

According to a known manufacturing method of a cylindrical sputtering target, a cylindrical sputtering target member is formed by thermal spraying on an outer circumferential surface of a cylindrical substrate, so that the cylindrical sputtering target member and the cylindrical substrate are integrated. According to another known manufacturing method of a cylindrical sputtering target, a cylindrical sputtering target member formed of a ceramic sintered compact separately formed is joined to a cylindrical substrate by use of a joining material such as a solder material or the like. In an example of the latter manufacturing method, a powdery material of a cylindrical sputtering target member is put on an outer circumferential surface of a cylindrical substrate and subjected to hot isostatic pressing (HIP).

With the method of integrating a cylindrical sputtering target member and a cylindrical substrate to manufacture a cylindrical sputtering target, it is difficult and uneconomical to reuse the cylindrical substrate. In addition, the cylindrical sputtering target member is cracked or chipped off at the time of sputtering due to a difference in the coefficient of thermal expansion between the cylindrical sputtering target member and the cylindrical substrate.

By contrast, with the method of joining a cylindrical sputtering target member formed of a ceramic sintered compact separately formed to a cylindrical substrate by use of a joining material such as a solder material or the like, the joining material such as a solder material or the like is provided between the cylindrical sputtering target member and the cylindrical substrate. Therefore, in the case where the space between the cylindrical sputtering target member and the cylindrical substrate is not sufficiently fulfilled with the joining material such as a solder material or the like, the joining performance is insufficient.

In the case where the joining performance is insufficient, the cylindrical sputtering target member, which is expanded at the time of sputtering, comes off from the cylindrical substrate and rotates idle, or the cylindrical sputtering target member is cracked or chipped off.

In order to join the cylindrical sputtering target member and the cylindrical substrate more strongly, Japanese Laid-Open Patent Publication No. 2010-18883 discloses the following: a cavity between the cylindrical sputtering target member and the cylindrical substrate is filled with a joining material such as a solder material or the like; the cylindrical sputtering target member, the cylindrical substrate and the joining material are cooled in an axial direction from one end thereof toward the other end thereof; and the joining material in a melted state is further supplied during the cooling. The joining material is supplied in this manner so as to improve the joining state and thus prevent the cylindrical sputtering target member from being cracked or chipped off.

Usually, a joining material such as a solder material or the like is provided in a liquid state to fill the cavity between the cylindrical sputtering target member and the cylindrical substrate. While being cooled after filling the cavity, the joining material is changed into a solid state to join the cylindrical sputtering target member and the cylindrical substrate to each other. In consideration of the amount of thermal contraction of the joining material that is caused by the cooling, the method disclosed in Japanese Laid-Open Patent Publication No. 2010-18883 is regarded as improving the ratio of the joining material filling the cavity by further supplying the joining material in such an amount that compensates for the amount of thermal contraction of the joining material.

However, the method disclosed in Japanese Laid-Open Patent Publication No. 2010-18883 merely compensates for the amount of thermal contraction of the joining material. Therefore, the method disclosed in this publication prevents the joining performance of the joining material merely in the axial direction of the cylindrical sputtering target member from being reduced due to the contraction at the time of cooling.

Regarding the contraction of the joining material, the contraction in a diametrical direction of the cylindrical sputtering target member needs to be considered as well as the contraction in the axial direction. A reason for this is that the cylindrical substrate and the cylindrical sputtering target member are easily delaminated from each other by the contraction of the joining material in the diametrical direction of the cylindrical sputtering target member. Even in the case where the cooling in the axial direction is started from the one end and the joining material in a melted state is supplied to the cavity, it is difficult to perform control such that the cavity does not include a space, which may be formed due to the contraction of the joining material in the diametrical direction of the cylindrical sputtering target member. A reason for this is that the joining material has a certain level of viscosity. Japanese Laid-Open Patent Publication No. 2010-18883 does not take a measure against a space formed, between the cylindrical sputtering target member and the joining material, due to the contraction of the joining material in the diametrical direction of the cylindrical sputtering target member.

The present invention has an object of providing a cylindrical sputtering target that has an improved joining performance between the cylindrical sputtering target member and the cylindrical substrate and prevents the cylindrical sputtering target member from being cracked of chipped off at the time of sputtering due to the difference in the coefficient of thermal expansion between the cylindrical sputtering target member and the cylindrical substrate, and a manufacturing method of the same.

SUMMARY

As a result of performing studies for the purpose of achieving the above-described object, the present inventors have found that in the case where the surface roughness of a surface of the cylindrical sputtering target member on the side of the joining material is made greater than the amount of thickness of the joining material decreased by the thermal contraction thereof, the delamination of the cylindrical sputtering material and the cylindrical substrate is prevented at the time of thermal contraction. Usually, the surface roughness of the surface of the cylindrical sputtering target member on the side of the cylindrical substrate is made as small as possible. By contrast, the present inventors have found that in the case where the surface roughness (Rz, or Rz and Ra) is made greater, and in addition, is defined in relation with the thickness of the joining material, the anchoring effect between the joining material and the cylindrical sputtering target member is improved. Thus, the present invention has been completed.

A cylindrical sputtering target in an embodiment according to the present invention includes a cylindrical substrate and a cylindrical sputtering target member joined together with a joining material. Where the joining material has a thickness, estimated from a difference between an inner diameter of the cylindrical sputtering target member and an outer diameter of the cylindrical substrate, of d (µm), the joining material has a coefficient of thermal expansion of $\alpha_1$ (µm/µmK), and a melting point of the joining material and room temperature have a difference of $\Delta T$ (K), a surface of the cylindrical sputtering target member on the side of the joining material has a value of ten-point average roughness (Rz) fulfilling d (µm)×$\alpha_1$ (µm/µmK)×$\Delta T$ (K)≤Rz (µm) (expression 1). There is no specific upper limit on the value of ten-point average roughness (Rz). A reason for this is that as the value of ten-point average roughness (Rz) is greater, the area size of the contact plane between the cylindrical sputtering target member and the joining material is made larger and thus the anchoring effect between the joining material and the cylindrical sputtering target member is improved. By contrast, the value of ten-point average roughness (Rz) needs to be greater than, or equal to, the amount of thermal contraction of the joining material formed of, for example, In or an In alloy as the solder material. Therefore, the lower limit of the value of ten-point average roughness (Rz) is preferably the amount of thermal contraction of the joining material.

In an embodiment according to the present invention, the surface of the cylindrical sputtering target member on the side of the joining material has a value of ten-point average roughness (Rz) fulfilling d (µm)×$\alpha_1$ (µm/µmK)×$\Delta T$ (K)≤Rz (µm) and also has a value of arithmetic average roughness (Ra) fulfilling d (µm)×$\alpha_1$ (µm/µmK)×$\Delta T$ (K)×0.1≤Ra (µm) (expression 2).

The cylindrical sputtering target member may be formed of ITO, IZO, IGZO or ITZO.

The joining material contains In or InSn. The joining material preferably has a thickness d fulfilling 0.5 mm≤d≤2.0 mm.

According to the present invention, even though the joining material is contracted in the diametrical direction of the cylindrical sputtering target when being changed from a liquid phase into a solid phase, the contact between the cylindrical sputtering target member and the joining material is better guaranteed than in the case of a cylindrical sputtering target in which a surface of a cylindrical sputtering target member on the side of a joining material has a value of ten-point average roughness (Rz) not fulfilling d (µm)×$\alpha_1$ (µm/µmK)×$\Delta T$ (K)≤Rz (µm). Thus, according to the present invention, the strength of joining between the cylindrical sputtering target member and the joining material is increased.

According to the present invention, even though the joining material is contracted to form a gap between the cylindrical sputtering target member and the joining material, such a gap alleviates the stress generated due to the difference in the coefficient of thermal expansion, among the cylindrical sputtering target member, the joining material and the cylindrical substrate, that is caused by the heat at the time of sputtering.

DESCRIPTION OF EMBODIMENTS

Figure 1:
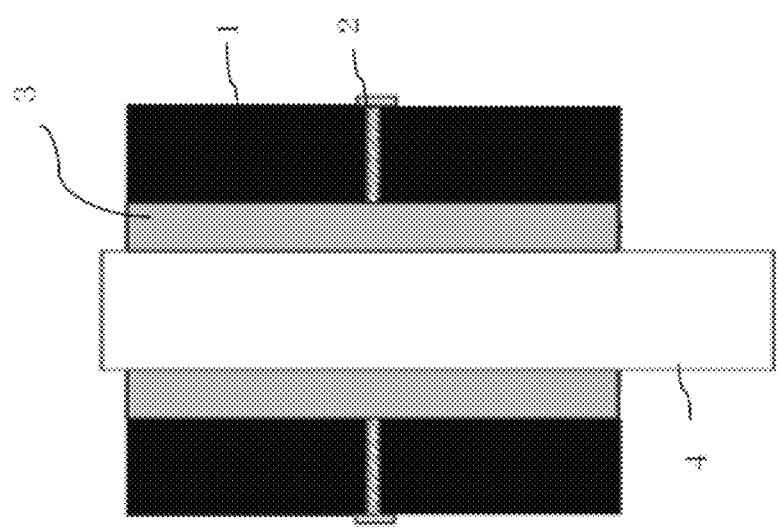
FIG. 1 is a schematic view showing a bonding step of joining a cylindrical sputtering target member and a cylindrical substrate to each other with a joining material in an embodiment according to the present invention.

Hereinafter, a cylindrical sputtering target and a manufacturing method thereof according to the present invention will be described with reference to the drawings. The cylindrical sputtering target and the manufacturing method thereof according to the present invention may be carried out in various different embodiments, and are not to be construed as being limited to any of the following embodiments. In the drawings referred to in the embodiments, components that are the same or have substantially the same functions bear the identical reference signs, and descriptions thereof will not be repeated.

A structure and a manufacturing method of a cylindrical sputtering target according to the present invention will be described. The cylindrical sputtering target according to the present invention will be described by way of examples, but is not limited to any of the following embodiments or examples.

Figure 2:
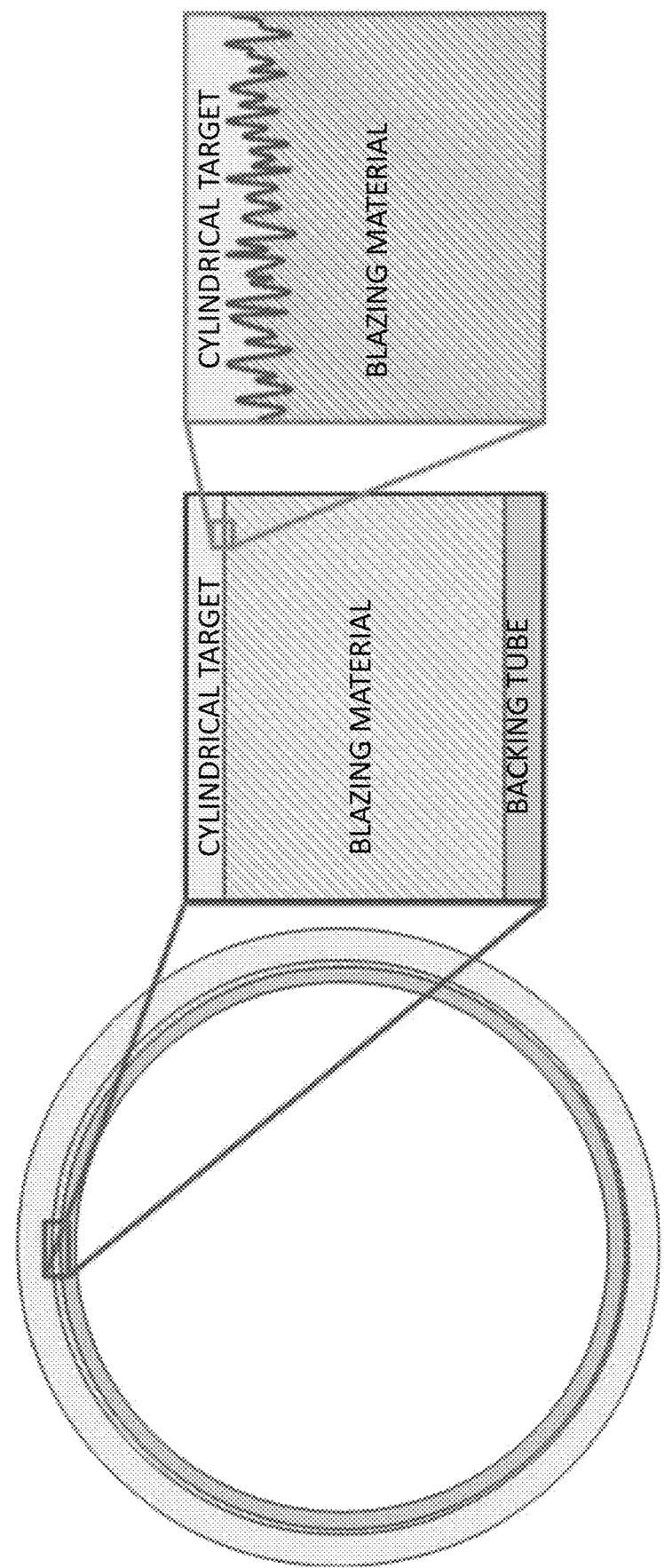
FIG. 2 is a schematic view of a surface of the cylindrical sputtering target member on the side of the joining material in the embodiment according to the present invention.

FIG. 1 is a schematic view showing a bonding step of joining a cylindrical sputtering target member and a cylindrical substrate to each other with a joining material in an embodiment according to the present invention. FIG. 2 is a schematic view of a surface of the cylindrical sputtering target member facing the joining material in the embodiment according to the present invention. The cylindrical sputtering target according to the present invention will be described with reference to FIG. 1 and FIG. 2.

A plurality of cylindrical sputtering target members 1, a cylindrical substrate 4 and a joining material 3 are prepared. There is no specific limitation on the outer diameter, the inner diameter or the length of the cylindrical sputtering target members 1 or the cylindrical substrate 4. It should be noted that the inner diameter of the cylindrical sputtering target members 1 and the outer diameter of the cylindrical substrate 4 define the width of a cavity formed between the cylindrical sputtering target members 1 and the cylindrical substrate 4 and the thickness of the joining material 3 filling the cavity. Therefore, the inner diameter of the cylindrical sputtering target members 1 and the outer diameter of the cylindrical substrate 4 are adjusted such that the joining material 3 has a desired thickness.

The cylindrical sputtering target members 1 are each formed of a ceramic sintered compact, for example, an ITO (indium tin oxide) sintered compact formed of indium, tin and oxygen, an AZO (aluminum zinc oxide) sintered compact formed of aluminum, zinc and oxygen, an IZO (indium zinc oxide) sintered compact formed of indium, zinc and oxygen, a $TiO_2$ sintered compact, or the like. Each of the cylindrical sputtering target members 1 is not limited to having any of the above-described compositions, and may be formed of any ceramic sintered compact.

The cylindrical substrate 4 may be formed of any of various materials, for example, copper (Cu), titanium (Ti), molybdenum (Mo) or an alloy containing a plurality of these elements.

The joining material 3 may be, for example, a solder material that contains low-melting point indium (In), or an In alloy containing Sn or the like. In the case where an In alloy is used for the joining material 3, it is preferable that In is contained at a content of 99.99% or greater in consideration of the melting point, the thermal conductivity and the like thereof.

First, a surface of each prepared cylindrical sputtering target member 1 that is to be joined to the cylindrical substrate 4 is roughened as shown in, for example, FIG. 2 by blasting, mechanical processing, belt sanding, rubbing with sandpaper, rubbing with blast medium or the like. In this step, the surface roughness is determined in accordance with the thickness of the joining material 3 and the amount of thermal contraction of the joining material 3. Where the thickness of the joining material 3 is d (μm), the coefficient of linear thermal expansion of the joining material 3 is $\alpha_1$ (μm/μmK), and the difference between the melting point of the joining material 3 and room temperature is ΔT (K), the surface of the cylindrical sputtering target member 1 that is to be joined to the cylindrical substrate 4 is preferably roughened so as to have a value of ten-point average roughness (Rz) fulfilling d (μm)×$\alpha_1$ (μm/μmK)×ΔT (K)≤Rz (μm) (expression 1).

The joining material 3 that is caused to flow between the cylindrical sputtering target members 1 and the cylindrical substrate 4 is in a liquid state immediately after being provided, and is present on the surface of the cylindrical substrate 4 and on the surface of each cylindrical sputtering target member 1 because of the fluidity thereof. Then, although it is not clearly known why the joining material 3 is solidified at the melting point and is contracted as the temperature is decreased to room temperature. This causes an undesirable possibility that a gap is formed between the joining material 3 and the surface of the cylindrical substrate 4 and also between the joining material 3 and the surface of each cylindrical sputtering target member 1. Especially between the surface of each cylindrical sputtering target member 1 and the joining material 3, such a gap is formed. Before the joining material 3 is caused to flow between the cylindrical sputtering target members 1 and the cylindrical substrate 4, the volume of each of the cylindrical sputtering target members 1 and the cylindrical substrate 4 is larger by the coefficient of linear thermal expansion than the usual volume thereof. The joining material 3 is caused to flow between the sputtering target members 1 and the cylindrical substrate 4 in such an enlarged state, and is cooled down to room temperature after being solidified. At this point, the joining material 3 is contracted most among the sputtering target members 1, the cylindrical substrate 4 and the joining material 3. It is seen by calculating the change in the diameter or the circumferential length of the joining material 3 that the joining material 3 tightens the cylindrical substrate 4 provided in the inside thereof. Therefore, defective joining occurs mainly on the side of the cylindrical sputtering target members 1.

The amount of the joining material 3 that is contracted by the temperature change after the joining material 3 is solidified at the melting point until the temperature is decreased to room temperature may be calculated by the expression d (μm)×$\alpha_1$ (μm/mK)×ΔT (K), where the coefficient of linear thermal expansion of the joining material 3 is $\alpha_1$ (μm/μmK) and the difference between the melting point of the joining material 3 and room temperature is ΔT (K). Therefore, the surface of each cylindrical sputtering target member 1 on the side of the joining material 3 may be roughened so as to have a value of ten-point average roughness (Rz), as the function of the thickness d of the joining material 3, fulfilling d (μm)×$\alpha_1$ (μm/μmK)×ΔT (K)≤Rz (μm) (expression 1). In this case, even though the joining material 3 is contracted by the value represented by d (μm)×$\alpha_1$ (μm/μmK)×ΔT (K), the area size of the surface of the cylindrical sputtering target member 1 that is in contact with the joining material 3 may be certainly made larger by the increase in the area size caused by the surface roughness, as compared with the case where the thickness of the joining material 3 and the amount of thermal contraction of the joining material 3 are not considered for roughening the surface of the cylindrical sputtering target member 1 that is to be on the side of the joining material 3.

The surface of the cylindrical sputtering target member 1 on the side of the joining material 3 may have a value of arithmetic average roughness (Ra) fulfilling d (μm)×$\alpha_1$ (μm/μmK)×ΔT (K)×0.1≤Ra (μm) (expression 2). A reason for this is that in the case where the arithmetic average roughness (Ra) is of a value fulfilling expression 2, the surface of the cylindrical sputtering target member 1 that is to be in contact with the joining material 3 has a desired surface roughness uniformly, and thus the area size of the above-described surface of the cylindrical sputtering target member 1 may be further increased.

The arithmetic average roughness (Ra) and the ten-point average roughness (Rz) in the present invention are defined by the JIS (JIS B 601: 1994).

Preferably, the surface of the cylindrical sputtering target member 1 that is to be on the side of the joining material 3 is roughened so as to entirely have a ten-point average roughness (Rz) value, or a ten-point average roughness (Rz) value and an arithmetic average roughness (Rz) value, that fulfill expression 1, or expressions 1 and 2. It may be checked in the following manner whether or not the above-described surface of the cylindrical sputtering target member 1 is roughened as described above. Each cylindrical sputtering target member 1 is subjected to measurement at 12 points defined at an equal interval in a longitudinal direction thereof, and it is checked whether or not the resultant ten-point average roughness (Rz) values at all the 12 points fulfill expression 1, or whether or not the resultant the ten-point average roughness (Rz) values and the arithmetic average roughness (Ra) values at all the 12 points fulfill expressions 1 and 2.

Next, the plurality of sputtering target members 1 having the above-described surface roughened are located such that central axes thereof match the central axis of the cylindrical substrate 4, and then are secured.

The thickness of the cavity defined by the inner diameter of the cylindrical sputtering target members 1 and the outer diameter of the cylindrical substrate 4 defines the thickness of the joining material 3 filling the cavity. The thickness of the cavity defined by the inner diameter of the cylindrical sputtering target members 1 and the outer diameter of the cylindrical substrate 4 is preferably 0.5 mm to 2.0 mm. In the case where the thickness is smaller than 0.5 mm, the joining material 3 in a liquid state is not easily caused to flow, which causes defective joining. By contrast, in the case where the thickness is larger than 2.0 mm, the thermal conductivity or the like is decreased, which may cause abnormal discharge or the like at the time of sputtering.

Next, the cylindrical sputtering target members 1 and the cylindrical substrate 4 are each heated by a heater (not shown) to a temperature higher than, or equal to, 157° C., and the joining material 3 in a melted state is caused to flow between an inner circumferential surface of the cylindrical sputtering target members 1 and an outer circumferential surface of the cylindrical substrate 4. Then, the temperature is gradually decreased from the level higher than, or equal to, 157° C. to solidify the joining material 3. In this manner, the cylindrical sputtering target members 1 are joined to the cylindrical substrate 4.

Example 1

A cylindrical sputtering target member 1 formed of an ITO sintered compact containing Sn at a content of 10% (outer diameter: 160 mmφ, inner diameter 136 mmφ, length: 200 mm), a cylindrical substrate 4 (outer diameter: 134 mmφ, inner diameter 120 mm+, length: 3000 mm), and a joining material 3 formed of an In alloy as a solder material were prepared. The joining material 3 was estimated to have a thickness of 1000 µm based on the difference between the inner diameter of the cylindrical sputtering target member 1 and the outer diameter of the cylindrical substrate 4. The In alloy used as a solder material in example 1 had a coefficient of thermal expansion of $32.1 \times 10^{-6}$ and a melting point of 156.6° C. When these parameters were applied to d (µm)×$\alpha_1$ (µm/mK)×ΔT (K)≤Rz (µm) (expression 1), a value of 4.38 µm or greater was obtained as the ten-point average roughness (Rz) according to the present invention. In this example, based on this result, a surface of the cylindrical sputtering target member 1 that was to be on the side of the joining material 3 was roughened by blasting so as to have a ten-point average roughness (Rz) value of 4.38 µm or greater.

Then, a phantom straight line was drawn in an axial direction of the above-described surface of the cylindrical sputtering target member 1 roughened in this manner, and was equally divided into 12. An arbitrary point on each of the divided lines was subjected to measurement. The measurement may be performed by use of a surface roughness meter SJ-301 produced by Mitutoyo Corporation under the following conditions: radius of stylus: 2 µm; feeding rate: 0.5 mm/sec.; cutoff: λc 0.8 mm; length for evaluation: 4.0 mm. In example 1, the average of the ten-point average roughness (Rz) values at the 12 points was 5 µm. In example 1, no control was performed on the arithmetic average roughness (Ra) and thus was found as follows. A phantom straight line was drawn in the axial direction of the above-described surface of the cylindrical sputtering target member 1, and was equally divided into 12. An arbitrary point on each of the divided lines was subjected to measurement. The average of the arithmetic average roughness (Ra) values at the 12 points was 0.4 µm.

The cylindrical sputtering target members 1 having the above-described surface roughened in this manner were joined to the cylindrical substrate 4 with the joining material 3 as shown in FIG. 1 to manufacture a cylindrical sputtering target.

The joining ratio of the cylindrical sputtering target in example 1 was measured by an ultrasonic flaw detector and found to be 98.0%.

Example 2

Example 2 was basically the same as example 1 except for the following point. In example 2, the arithmetic average roughness (Ra) was controlled to fulfill d (µm)×$\alpha_1$ (µm/µmK)×ΔT (K)×0.1≤Ra (µm) (expression 2). The solder material formed of an In alloy had a coefficient of thermal expansion of $32.1 \times 10^{-6}$ and a melting point of 156.6° C. The arithmetic average roughness (Ra) fulfilling d (µm)×$\alpha_1$ (µm/µmK)×ΔT (K)×0.1≤Ra (µm) was 0.438 µm or greater. In example 2, based on this result, the surface of the cylindrical sputtering target member 1 that was to be on the side of the joining material 3 was roughened by blasting so as to have a ten-point average roughness (Rz) value of 4.38 µm or greater and an arithmetic average roughness (Ra) value of 0.438 µm or greater.

Then, a phantom straight line was drawn in an axial direction of the above-described surface of the cylindrical sputtering target member 1 roughened in this manner, and was equally divided into 12. An arbitrary point on each of the divided lines was subjected to measurement. In example 2, the average of the ten-point average roughness (Rz) values at the 12 points was 6 µm. The average of the arithmetic average roughness (Ra) values at the 12 points was 0.8 µm.

The cylindrical sputtering target members 1 having the above-described surface roughened in this manner in example 2 were joined to the cylindrical substrate 4 with the joining material 3 as shown in FIG. 1 to manufacture a cylindrical sputtering target.

The joining ratio of the cylindrical sputtering target in example 2 was measured by an ultrasonic flaw detector and found to be 99.0%. In example 2, unlike in example 1, the surface was roughened so as to have an arithmetic average (Ra) value fulfilling expression 2 according to the present invention. Therefore, the joining ratio of the cylindrical sputtering target in example 2 was higher than that in example 1.

Example 3

Example 3 was basically the same as example 1 except for the following point. In example 3, the ten-point average roughness (Rz) and the arithmetic average roughness (Ra) of the surface of the cylindrical sputtering target member 1 on the side of the joining material 3 were of different values from those in example 1.

In example 3, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 8 µm. The average of the arithmetic average roughness (Ra) values at the 12 points was 1.1 µm. In example 3, the ten-point average roughness (Rz) values and the arithmetic average roughness (Ra) values of the above-described surface all fulfilled expression 1 and expression 2 according to the present invention, respectively.

The cylindrical sputtering target members 1 having the above-described surface roughened in this manner in example 3 were joined to the cylindrical substrate 4 with the joining material 3 as shown in FIG. 1 to manufacture a cylindrical sputtering target.

The joining ratio of the cylindrical sputtering target in example 3 was measured by an ultrasonic flaw detector and found to be 99.5%. In example 3, the ten-point average roughness (Rz) values and the arithmetic average (Ra) values were both larger than those in example 2. Therefore, the joining ratio of the cylindrical sputtering target in example 3 was still higher than that in example 2.

Example 4

Example 4 was basically the same as example 1 except for the following point. In example 4, the ten-point average roughness (Rz) and the arithmetic average roughness (Ra) of the surface of the cylindrical sputtering target member 1 on the side of the joining material 3 were of different values from those in example 1.

In example 4, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 14 μm. The average of the arithmetic average roughness (Ra) values at the 12 points was 2.1 μm. In example 4, the ten-point average roughness (Rz) values and the arithmetic average roughness (Ra) values of the above-described surface all fulfilled expression 1 and expression 2 according to the present invention, respectively.

The cylindrical sputtering target members 1 having the above-described surface roughened in this manner in example 4 were joined to the cylindrical substrate 4 with the joining material 3 as shown in FIG. 1 to manufacture a cylindrical sputtering target.

The joining ratio of the cylindrical sputtering target in example 4 was measured by an ultrasonic flaw detector and found to be 99.7%. In example 4, the ten-point average roughness (Rz) values and the arithmetic average (Ra) values were both larger than those in example 3. Therefore, the joining ratio of the cylindrical sputtering target in example 4 was still higher than that in example 3.

Example 5

Example 5 was basically the same as example 1 except for the following point. In example 5, the ten-point average roughness (Rz) and the arithmetic average roughness (Ra) of the surface of the cylindrical sputtering target member 1 on the side of the joining material 3 were of different values from those in example 1.

In example 5, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 7 μm. The average of the arithmetic average roughness (Ra) values at the 12 points was 1 μm. In example 5, the ten-point average roughness (Rz) values and the arithmetic average roughness (Ra) values of the above-described surface all fulfilled expression 1 and expression 2 according to the present invention, respectively.

The cylindrical sputtering target members 1 having the above-described surface roughened in this manner in example 5 were joined to the cylindrical substrate 4 with the joining material 3 as shown in FIG. 1 to manufacture a cylindrical sputtering target.

The joining ratio of the cylindrical sputtering target in example 5 was measured by an ultrasonic flaw detector and found to be 99.0%.

Example 6

Example 6 was basically the same as example 1 except for the following points. In example 6, the joining material 3 had a thickness of 1500 μm (difference between the inner diameter of the cylindrical sputtering target member 1 and the outer diameter of the cylindrical substrate 4 was 1500 μm). The ten-point average roughness (Rz) and the arithmetic average roughness (Ra) of the surface of the cylindrical sputtering target member 1 on the side of the joining material 3 were of different values from those in example 1.

In example 6, the joining material 3 was formed of the same material as that in example 1 but had a thickness of 1500 μm. The ten-point average roughness (Rz) and the arithmetic average roughness (Ra) were respectively calculated based on expression 1 and expression 2 according to the present invention. The ten-point average roughness (Rz) was 6.58 μm or greater, and the arithmetic average roughness (Ra) was 0.658 μm or greater.

In example 6, the surface of the cylindrical sputtering target member 1 that was to be on the side of the joining material 3 was roughened by blasting so as to have a ten-point average roughness (Rz) value of 6.58 μm or greater and an arithmetic average roughness (Ra) value of 0.658 μm or greater.

In example 6, a phantom straight line was drawn in an axial direction of the above-described surface of the cylindrical sputtering target member 1, and was equally divided into 12. An arbitrary point on each of the divided lines was subjected to measurement. The average of the ten-point average roughness (Rz) values at the 12 points was 9 μm. The average of the arithmetic average roughness (Ra) values at the 12 points was 1.3 μm. In example 6, the ten-point average roughness (Rz) values and the arithmetic average roughness (Ra) values of the above-described surface all fulfilled expression 1 and expression 2 according to the present invention, respectively.

The cylindrical sputtering target members 1 having the above-described surface roughened in this manner in example 6 were joined to the cylindrical substrate 4 with the joining material 3 as shown in FIG. 1 to manufacture a cylindrical sputtering target.

The joining ratio of the cylindrical sputtering target in example 6 was measured by an ultrasonic flaw detector and found to be 98.0%.

Example 7

Example 7 was basically the same as example 1 except for the following points. In Example 7, the cylindrical sputtering target member 1 was formed of IZO, and the ten-point average roughness (Rz) and the arithmetic average roughness (Ra) of the surface of the cylindrical sputtering target member 1 on the side of the joining material 3 were of different values from those in example 1.

In example 7, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 6 µm. The average of the arithmetic average roughness (Ra) values at the 12 points was 0.8 µm. In example 7, the ten-point average roughness (Rz) values and the arithmetic average roughness (Ra) values of the above-described surface all fulfilled expression 1 and expression 2 according to the present invention, respectively.

The cylindrical sputtering target members 1 having the above-described surface roughened in this manner in example 7 were joined to the cylindrical substrate 4 with the joining material 3 as shown in FIG. 1 to manufacture a cylindrical sputtering target.

The joining ratio of the cylindrical sputtering target in example 7 was measured by an ultrasonic flaw detector and found to be 99.0%.

Example 8

Example 8 was basically the same as example 1 except for the following points. In Example 8, the cylindrical sputtering target member 1 was formed of IGZO, and the ten-point average roughness (Rz) and the arithmetic average roughness (Ra) of the surface of the cylindrical sputtering target member 1 on the side of the joining material 3 were of different values from those in example 1.

In example 8, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 8 µm. The average of the arithmetic average roughness (Ra) values at the 12 points was 1.1 µm. In example 8, the ten-point average roughness (Rz) values and the arithmetic average roughness (Ra) values of the above-described surface all fulfilled expression 1 and expression 2 according to the present invention, respectively.

The cylindrical sputtering target members 1 having the above-described surface roughened in this manner in example 8 were joined to the cylindrical substrate 4 with the joining material 3 as shown in FIG. 1 to manufacture a cylindrical sputtering target.

The joining ratio of the cylindrical sputtering target in example 8 was measured by an ultrasonic flaw detector and found to be 99.0%.

Example 7 and example 8 were different from each other in the material of the cylindrical sputtering target member 1 but were the same as each other in that the ten-point average roughness (Rz) values and the arithmetic average roughness (Ra) values fulfilled expression 1 and expression 2, respectively. Both in example 7 and example 8, the joining ratio was 99.0%. From this, it is seen that in the case where the ten-point average roughness (Rz) and the arithmetic average roughness (Ra) of the above-described surface are controlled to fulfill expression 1 and expression 2 respectively, the joining ratio of the cylindrical sputtering target member 1 and the cylindrical substrate 4 is improved regardless of the material of the cylindrical sputtering target member 1.

Comparative Example 1

Comparative example 1 was basically the same as example 1 except for the following point. In comparative example 1, the ten-point average roughness (Rz) and the arithmetic average roughness (Ra) of the surface of the cylindrical sputtering target member 1 on the side of the joining material 3 were of different values from those in example 1.

In comparative example 1, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 4 µm. The average of the arithmetic average roughness (Ra) values at the 12 points was 0.5 µm. In comparative example 1, the ten-point average roughness (Rz) values of the above-described surface did not fulfill expression 1 according to the present invention, whereas the arithmetic average roughness (Ra) values of the above-described surface fulfilled expression 2 according to the present invention.

The cylindrical sputtering target members 1 having the above-described surface roughened in this manner in comparative example 1 were joined to the cylindrical substrate 4 with the joining material 3 as shown in FIG. 1 to manufacture a cylindrical sputtering target.

The joining ratio of the cylindrical sputtering target in comparative example 1 was measured by an ultrasonic flaw detector and found to be 95.0%.

Comparative Example 2

Comparative example 2 was basically the same as example 1 except for the following point. In comparative example 2, the ten-point average roughness (Rz) and the arithmetic average roughness (Ra) of the surface of the cylindrical sputtering target member 1 on the side of the joining material 3 were of different values from those in example 1.

In comparative example 2, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 1 µm. The average of the arithmetic average roughness (Ra) values at the 12 points was 0.2 µm. In comparative example 2, neither the ten-point average roughness (Rz) values nor the arithmetic average roughness (Ra) values of the above-described surface fulfilled expression 1 or expression 2 according to the present invention.

The cylindrical sputtering target members 1 having the above-described surface roughened in this manner in comparative example 2 were joined to the cylindrical substrate 4 with the joining material 3 as shown in FIG. 1 to manufacture a cylindrical sputtering target.

The joining ratio of the cylindrical sputtering target in comparative example 2 was measured by an ultrasonic flaw detector and found to be 92.0%.

Comparative Example 3

Comparative example 3 was basically the same as example 6 except for the following point. In comparative example 3, the ten-point average roughness (Rz) and the arithmetic average roughness (Ra) of the surface of the cylindrical sputtering target member 1 on the side of the joining material 3 were of different values from those in example 6.

In comparative example 3, a phantom straight line was drawn in an axial direction of the surface of the cylindrical sputtering target member 1 that was to be on the side of the joining material 3, and was equally divided into 12. An arbitrary point on each of the divided lines was subjected to measurement. The average of the ten-point average roughness (Rz) values at the 12 points was 4 μm. The average of the arithmetic average roughness (Ra) values at the 12 points was 0.6 μm. In comparative example 3, neither the ten-point average roughness (Rz) values nor the arithmetic average roughness (Ra) values of the above-described surface fulfilled expression 1 or expression 2 according to the present invention.

The cylindrical sputtering target members 1 having the above-described surface roughened in this manner in comparative example 3 were joined to the cylindrical substrate 4 with the joining material 3 as shown in FIG. 1 to manufacture a cylindrical sputtering target.

The joining ratio of the cylindrical sputtering target in comparative example 3 was measured by an ultrasonic flaw detector and found to be 93.0%.

Analysis results and the like of examples 1 through 8 and comparative examples 1 through 3 are shown in Table 1. The ten-point average roughness (Rz) and the arithmetic average roughness (Ra) in Table 1 are each an average value of the 12 points.

The present invention is not limited to the above-described embodiment, and may be appropriately modified without departing from the gist thereof.

DESCRIPTION OF THE REFERENCE SIGNS

1 Cylindrical sputtering target member
2 Spacer
3 Joining member
4 Cylindrical substrate

What is claimed is:
1. A cylindrical sputtering target, comprising:
a cylindrical substrate and a cylindrical sputtering target member joined together with a joining material that is in contact with the cylindrical substrate and the cylindrical sputtering target member from one end of the cylindrical sputtering target member to the other end of the cylindrical sputtering target member;
wherein where the joining material has a thickness, estimated from a difference between an inner diameter of the cylindrical sputtering target member and an outer diameter of the cylindrical substrate, of d (μm), the joining material has a coefficient of thermal expansion of $\alpha_1$ (μm/μK), and a melting point of the joining material and room temperature have a difference of $\Delta T$ (K), a surface of the cylindrical sputtering target member on the side of the joining material has concave and convex portions having a value of ten-point average roughness (Rz) fulfilling:

TABLE 1

| | | | | | Target parameters | | | | |
|---|---|---|---|---|---|---|---|---|---|
| | Composition | Material of substrate | Type of joining material | Thickness of joining material (μm) | Melting point of joining material (° C.) | Coefficient of linear thermal expansion of joining material ($\alpha$(μm/μmK)) | Contraction amount of joining material (d × $\alpha$ × $\Delta T$ (μm)) | Target surface roughness Rz (μm) | Target surface roughness Ra (μm) | Evaluation Joining ratio (%) |
| Example 1 | Sn 10%-ITO | Ti | In | 1000 | 156.6 | 32.1 × 10$^{-6}$ | 4.38 | 5 | 0.4 | 98.0% |
| Example 2 | Sn 10%-ITO | Ti | In | 1000 | 156.6 | 32.1 × 10$^{-6}$ | 4.38 | 6 | 0.8 | 99.0% |
| Example 3 | Sn 10%-ITO | Ti | In | 1000 | 156.6 | 32.1 × 10$^{-6}$ | 4.38 | 8 | 1.1 | 99.5% |
| Example 4 | Sn 10%-ITO | Ti | In | 1000 | 156.6 | 32.1 × 10$^{-6}$ | 4.38 | 14 | 2.1 | 99.7% |
| Example 6 | Sn 10%-ITO | Ti | In | 1500 | 156.6 | 32.1 × 10$^{-6}$ | 6.58 | 9 | 1.3 | 98.0% |
| Example 7 | IZO | Ti | In | 1000 | 156.6 | 32.1 × 10$^{-6}$ | 4.38 | 6 | 0.8 | 99% |
| Example 8 | IGZO | Ti | In | 1000 | 156.6 | 32.1 × 10$^{-6}$ | 4.38 | 8 | 1.1 | 99% |
| Example 5 | Sn 10%-ITO | Ti | In | 1000 | 156.6 | 32.1 × 10$^{-6}$ | 4.38 | 7 | 1 | 99% |
| Comparative example 1 | Sn 10%-ITO | Ti | In | 1000 | 156.6 | 32.1 × 10$^{-6}$ | 4.38 | 4 | 0.5 | 95% |
| Comparative example 2 | Sn 10%-ITO | Ti | In | 1000 | 156.6 | 32.1 × 10$^{-6}$ | 4.38 | 1 | 0.2 | 92% |
| Comparative example 3 | Sn 10%-ITO | Ti | In | 1500 | 156.6 | 32.1 × 10$^{-6}$ | 6.58 | 4 | 0.6 | 93% |

As is clear from Table 1, regarding the surface roughness of the surface of the cylindrical sputtering target member 1 on the side of the joining material 3, in the case where the surface has a ten-point average roughness (Rz) value fulfilling d (μm)×$\alpha_1$ (μm/μmK)×$\Delta T$ (K)≤Rz (μm) (expression 1), the joining ratio between the cylindrical sputtering target member 1 and the joining material 3 is high regardless of the material of the cylindrical sputtering target member 1. In the case where the surface also has an arithmetic average roughness (Ra) value fulfilling d (μm)×$\alpha_1$ (μm/μmK)×$\Delta T$ (K)×0.1≤Ra (μm) (expression 2), the joining ratio is higher.

$$d\ (\mu m) \times \alpha_1\ (\mu m/\mu mK) \times \Delta T\ (K) \leq Rz\ (\mu m) \leq 14\ (\mu m),$$
and wherein the joining material is in contact with the concave and convex portions.

2. The cylindrical sputtering target according to claim 1, wherein the surface of the cylindrical sputtering target member on the side of the joining material has a value of arithmetic average roughness (Ra) fulfilling:

$$d\ (\mu m) \times \alpha_1\ (\mu m/\mu mK) \times \Delta T\ (K) \times 0.1 \leq Ra\ (\mu m).$$

3. The cylindrical sputtering target according to claims 1, wherein the cylindrical sputtering target member is formed of ITO, IZO, IGZO or ITZO.

4. The cylindrical sputtering target according to claim 1, wherein the joining material contains In or InSn.

5. The cylindrical sputtering target according to claim 1, wherein the joining material has a thickness d fulfilling 0.5 mm≤d≤2.0 mm.

6. The cylindrical sputtering target according to claim 2, wherein the joining material has a thickness d fulfilling 0.5 mm≤d≤2.0 mm.

* * * * *